United States Patent
Ahn

(10) Patent No.: US 8,830,744 B2
(45) Date of Patent: Sep. 9, 2014

(54) SEMICONDUCTOR DEVICE AND METHOD OF PROGRAMMING THE SAME

(75) Inventor: Sung Hoon Ahn, Seoul (KR)

(73) Assignee: SK Hynix Inc., Gyeonggi-do (KR)

(*) Notice: Subject to any disclaimer, the term of this patent is extended or adjusted under 35 U.S.C. 154(b) by 277 days.

(21) Appl. No.: 13/492,287

(22) Filed: Jun. 8, 2012

(65) Prior Publication Data

US 2012/0314501 A1 Dec. 13, 2012

(30) Foreign Application Priority Data

Jun. 9, 2011 (KR) .................. 10-2011-0055529

(51) Int. Cl.
*G11C 16/04* (2006.01)
*G11C 16/10* (2006.01)
*G11C 16/34* (2006.01)

(52) U.S. Cl.
CPC ............ *G11C 16/10* (2013.01); *G11C 16/3427* (2013.01); *G11C 16/0483* (2013.01)
USPC ................................ 365/185.03; 365/185.17

(58) Field of Classification Search
USPC .......................... 365/185.03, 185.17, 185.28
See application file for complete search history.

(56) References Cited

U.S. PATENT DOCUMENTS 7,366,014 B2 * 4/2008 Micheloni et al. ........ 365/185.03

FOREIGN PATENT DOCUMENTS

KR 10-0769776 B1 10/2007

* cited by examiner

*Primary Examiner* — Vu Le
(74) *Attorney, Agent, or Firm* — William Park & Associates Patent Ltd.

(57) ABSTRACT

A method of programming a semiconductor device includes performing a Least Significant Bit (LSB) program operation on selected memory cells, performing a soft program operation on the remaining memory cells other than memory cells on which the LSB program operation has been performed, and performing a Most Significant Bit (MSB) program operation on memory cells, selected from among the memory cells on which the LSB program operation has been performed and the memory cells on which the soft program operation has been performed.

11 Claims, 4 Drawing Sheets

SEMICONDUCTOR DEVICE AND METHOD OF PROGRAMMING THE SAME

CROSS-REFERENCE TO RELATED APPLICATION

The present application claims priority to Korean patent application number 10-2011-0055529 filed on Jun. 9, 2011, in the Korean Intellectual Property Office, the entire disclosure of which is incorporated by reference herein.

BACKGROUND

1. Field of the Invention

An embodiment of this disclosure relates to a semiconductor device and a method of programming the same and, more particularly, to a semiconductor device and a method of programming the same, which reduce interference between adjacent cells in a program operation.

2. Description of the Related Art

FIG. 1 is a circuit diagram of a memory cell array for illustrating the problems of a known program operation.

The memory cell array of a NAND flash memory device, from among semiconductor devices, is described below with reference to FIG. 1.

A memory cell array of a NAND flash memory device includes a plurality of memory blocks. Each of the memory blocks includes memory strings STe and STo. Each of the memory strings STe and STo includes a drain select transistor, a plurality of memory cells, and a source select transistor which are coupled in series. The gates of drain select transistors included in different memory strings STe and STo are coupled to a common drain select line DSL, and gates of the source select transistors included in different memory strings STe and STo are coupled to a common source select line SSL. Furthermore, in different memory strings STe and STo, gates of memory cells included in the same row are coupled to respective word lines WLn−k to WLn+k corresponding to the row.

When a program operation is started, all memory cells included in a selected memory block are erased and the erased memory cells are programmed by page (that is, a group of memory cells coupled to the same word line). In order to suppress interference between adjacent memory strings STe and STo occurring when the erased memory cells are programmed, the memory strings are divided into even memory strings STe and odd memory strings STo, and a program operation is performed on the even memory strings STe and then on the odd memory strings STo. That is, if the even memory strings STe are selected and programmed, the odd memory strings STo are not programmed.

In order to suppress interference between adjacent memory cells, a program operation using an Incremental Step Pulse (hereinafter referred to as an 'ISPP') method may be performed by gradually raising a program voltage.

Although the odd or even memory strings are selected and a program operation using an ISPP method is performed as described above, interference 2ΔX+2ΔY still occurs between adjacent memory cells within the same memory string and adjacent memory cells within the same page.

FIG. 2 is a graph illustrating a shift in threshold voltages according to the known program operation.

Referring to FIG. 2, for example, a memory cell 10 coupled to the $n^{th}$ word line WLn and an odd memory string STo is subjected to interferences 2ΔY when two memory cells 22 and 24 included in the same odd memory string STo as the memory cell 10 are programmed, and the memory cell 10 is also subjected to interferences 2ΔX when two memory cells 32 and 34 included in the same word line WLn as the memory cell 10 are programmed. For this reason, the one memory cell 10 is subject to the interferences '2ΔX+2ΔY', thus having a threshold voltage 42 higher than a target threshold voltage 40.

BRIEF SUMMARY

In accordance with an example embodiment of this disclosure, interferences between adjacent memory cells occurring in a program operation can be reduced by changing an order of operations, such as soft program operation, least significant bit program, and most significant bit program, on erased memory cells.

A method of programming a semiconductor device according to an aspect of the present disclosure includes performing a Least Significant Bit (LSB) program operation on selected memory cells; performing a soft program operation on the remaining memory cells other than memory cells on which the LSB program operation has been performed; and performing a Most Significant Bit (MSB) program operation on memory cells, selected from among the memory cells on which the LSB program operation has been performed and the memory cells on which the soft program operation has been performed.

A method of programming a semiconductor device according to another aspect of the present disclosure includes performing an even LSB program operation on an even page including numbered memory cells, from among memory cells coupled to a selected word line; performing an odd LSB program operation on an odd page including odd memory cells, from among the memory cells coupled to the selected word line; performing an even soft program operation of raising the threshold voltages of memory cells having an erase state, from among the even memory cells included in the even page; performing an odd soft program operation of raising the threshold voltages of memory cells having an erase state, from among the odd memory cells included in the odd page; performing an even MSB program operation on the even page; and performing an odd MSB program operation on the odd page.

The method further includes performing the even soft program operation comprising raising the threshold voltages of memory cells having an erase state, from among even memory cells coupled to a word line adjacent to the selected word line, before performing the odd LSB program operation.

The method further includes performing the odd soft program operation comprising raising the threshold voltages of memory cells having an erase state, from among odd memory cells coupled to a word line adjacent to the selected word line, after performing the odd LSB program operation.

A method of programming a semiconductor device according to yet another aspect of the present disclosure includes performing a first LSB program operation on a first page including memory cells coupled to a first word line, from among a plurality of memory cells included in memory strings; performing a second LSB program operation on a second page including memory cells coupled to a second word line adjacent to the first word line; performing a first soft program operation on memory cells having an erase state, from among the memory cells included in the first page; performing a third LSB program operation on a third page including memory cells coupled to a third word line adjacent to the second word line; performing a second soft program operation on memory cells having an erase state, from among the memory cells included in the second page; and performing a first MSB program operation on the first page.

A method of programming a semiconductor device according to further yet another aspect of the present disclosure includes performing an LSB program operation on a first even page including even memory cells coupled to a first word line, from among memory cells included in even-numbered memory strings; performing the LSB program operation on a first odd page including odd memory cells coupled to the first word line, from among memory cells included in odd-numbered memory strings; performing the LSB program operation on a second even page including memory cells coupled to a second word line adjacent to the first word line, from among the memory cells included in the even-numbered memory strings; performing the LSB program operation on a second odd page including memory cells coupled to the second word line, from among the memory cells included in the odd-numbered memory strings; performing a soft program operation of raising the threshold voltages of memory cells having an erase state, from among the memory cells included in the first odd page; performing the soft program operation of raising the threshold voltages of memory cells having an erase state, from among the memory cells included in the second odd page; and performing a Most Significant Bit (MSB) program operation on the first even page.

The method further includes performing the LSB program operation on a third even page including memory cells coupled to a third word line adjacent to the second word line, from among the memory cells included in the even-numbered memory strings, after performing a soft program operation of raising the threshold voltages of memory cells having an erase state, from among the memory cells included in the first odd page.

The method further includes performing the LSB program operation on a third odd page including memory cells coupled to the third word line, from among the memory cells included in the odd-numbered memory strings, after performing the LSB program operation on a third even page.

The method further includes performing the MSB program operation on the first odd page, after performing the MSB program operation on the first even page.

The method further includes performing the soft program operation of raising the threshold voltages of memory cells having an erase state, from among the memory cells included in the first even page, between performing the LSB program operation on the second even page and the LSB program operation on the second odd page.

A semiconductor device according to an aspect of the present disclosure includes a memory cell array configured to include a plurality of memory blocks; a row decoder coupled to the memory cell array through word lines; a page buffer group coupled to the memory cell array through bit lines; and a controller configured to control the page buffer group so that an LSB program operation is performed on selected memory cells included in a memory block selected from among the memory blocks, a soft program operation is performed on remaining memory cells other than memory cells on which the LSB program operation has been performed, from among the memory cells included in the selected memory block, and an MSB program operation is performed on memory cells, selected from among the memory cells on which the LSB program operation has been performed and the memory cells on which the soft program operation has been performed.

DESCRIPTION OF EMBODIMENTS

Hereinafter, some example embodiments of the present disclosure will be described in detail with reference to the accompanying drawings. The figures are provided to allow those having ordinary skill in the art to understand a scope of the embodiments of the disclosure.

Figure 1:
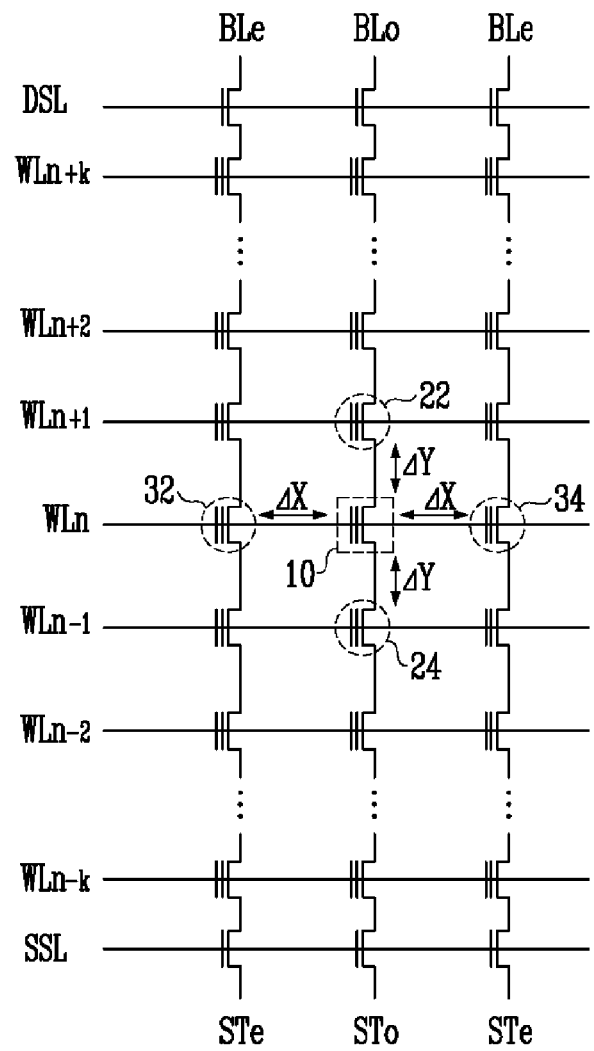
FIG. 1 is a circuit diagram of a memory cell array for illustrating the problems of a known program operation.
Figure 2:
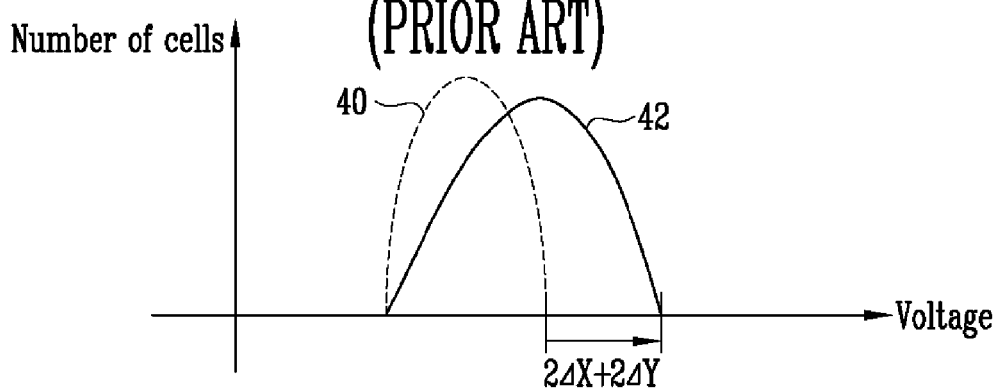
FIG. 2 is a graph illustrating a shift in threshold voltages according to the known program operation.
Figure 3:
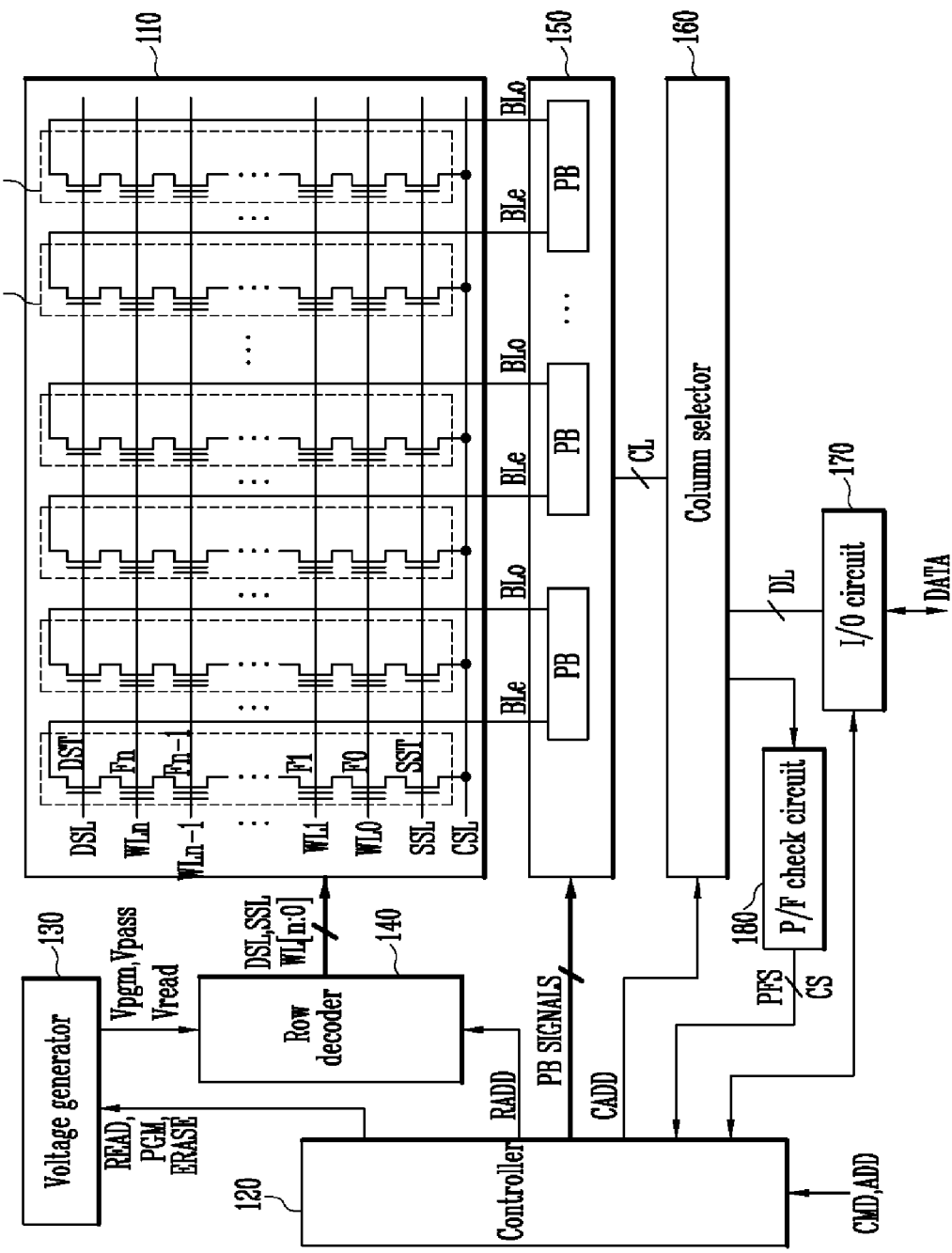
FIG. 3 is a block diagram of a semiconductor device for illustrating a program operation according to the present disclosure.

FIG. 3 is a block diagram of a semiconductor device for illustrating a program operation according to the present disclosure.

Referring to FIG. 3, the semiconductor memory device includes a memory cell array 110, a plurality of circuits (130, 140, 150, 160, 170, and 180) configured to perform a program operation or a read operation on memory cells included in the memory cell array 110, and a controller 120 configured to control the plurality of circuits (130, 140, 150, 160, 170, and 180) in order to set the threshold voltages of selected memory cells based on input data.

The circuits of a NAND flash memory device may include a voltage generator 130, a row decoder 140, a page buffer group 150, a column selector 160, an input/output (I/O) circuit 170, and a pass/fail (P/F) check circuit 180.

The memory cell array 110 includes a plurality of memory blocks. For the sake of simplicity only one memory block is shown in FIG. 3. The memory block includes a plurality of memory strings STe and STo. Some of the memory strings STe and STo are designated as normal memory strings, and some of the memory strings STe and STo are designated as flag strings. The memory strings STe and STo have a substantially similar configuration. Each of the memory strings STe and STo includes a source select transistor SST coupled to a common source line CSL, a plurality of memory cells F0 to Fn, and a drain select transistor DST coupled to a bit line. Memory cells included in the flag string are called flag cells, but flag cells have a substantially similar configuration as normal memory cells. The gate of the source select transistor SST is coupled to a source select line SSL, the gates of the memory cells F0 to Fn are coupled to respective word lines WL0 to WLn, and the gate of the drain select transistor DST is coupled to a drain select line DSL. The memory strings STe and STo are coupled between the common source line CSL and respective bit lines BLe and BLo. In the bit lines BLe and BLo, even-numbered bit lines are called even bit lines BLe, and odd-numbered bit lines are called odd bit lines BLo. Furthermore, memory strings coupled to the even bit lines BLe are called even memory strings STe, and memory strings coupled to the odd bit lines BLo are called odd memory strings STo.

The controller 120 generates a program operation signal PGM, a read operation signal READ, or an erase operation signal ERASE in response to a command signal CMD. The controller 120 also generates page buffer signals PB SIGNALS for controlling the page buffers PB of the page buffer group 150 according to a type of an operation. The controller 120 generates a row address signal RADD and a column address signal CADD in response to an address signal ADD. Furthermore, the controller 120 checks whether the threshold voltages of selected memory cells have risen or dropped to a target voltage in response to a count signal CS generated from the P/F check circuit 180 in a program or erase verify operation, and the controller 120 determines whether to perform a program or erase operation again or whether the result of the program or erase operation is a pass or fail based on the result of the check.

In particular, the controller 120 controls an erase operation on a selected memory cell block and a soft program operation, a Least Significant Bit (hereinafter referred to as an LSB) program operation, and a Most Significant Bit (hereinafter referred to as an MSB) program operation on selected memory cells in a program operation. More particularly, the controller 120 controls the plurality of circuits (130, 140, 150, 160, 170, and 180) so that, after an LSB program operation is performed on memory cells selected from among erased memory cells, a soft program operation is performed on memory cells having an erase state on which the LSB program has not been completed and an MSB program operation is performed on memory cells on which the soft program operation has been completed.

The voltage supply circuit (130 and 140) supplies voltages for a program operation, an erase operation, and a read operation on memory cells to the drain select line DSL, the word lines WL0 to WLn, and the source select line SSL of a selected memory block in response to the signals PGM, ERASE, READ, and RADD of the controller 120. The voltage supply circuit includes the voltage generator 130 and the row decoder 140.

The voltage generator 130 outputs operating voltages for programming, reading, or erasing memory cells in response to the operating signals PGM, READ, and ERASE, that is, the internal command signals of the controller 120 to global lines. If memory cells are programmed, the voltage generator 130 outputs operating voltages (for example, Vpgm, Vpass, and Vread) for programming global lines.

The row decoder 140 transfers the operating voltages of the voltage generator 130 to the lines DSL, SSL, and WL[n:0] of a selected memory block in response to the row address signals RADD of the controller 120.

The page buffer group 150 detects the program state or erase state of memory cells. The page buffer group 150 includes the page buffers PB each coupled to a pair of the bit lines BLe and BLo and supplies voltages necessary to store data in the memory cells F0 to Fn to each of the bit lines BLe and BLo in response to the page buffer signals PB SIGNALS of the controller 120.

More particularly, the page buffer group 150 precharges the bit lines BLe and BLo or latches data, corresponding to the threshold voltages of the memory cells F0 to Fn which are detected based on a shift in voltages of the bit lines BLe and BLo, in a program operation, an erase operation, or a read operation performed on the memory cells F0 to Fn. That is, in the program operation, each of the page buffers PB included in the page buffer group 150 supplies a program permission voltage 0 V to the bit line BLe or BLo when program data inputted to its latch is '0', and each of the page buffers PB supplies a program inhibition voltage Vcc to the bit line BLe or BLo when program data inputted to the latch is '1'. Furthermore, in the read operation, the page buffer PB controls voltage of the bit line BLe or BLo based on data stored in the memory cells F0 to Fn and detects data stored in the memory cells F0 to Fn.

The column selector 160 selects the page buffers PB of the page buffer group 150 in response to the column address signal CADD communicated from the controller 120. Data latched in a page buffer selected by the column selector 160 is outputted. Furthermore, the column selector 160 receives data from the page buffer group 150 through a column line CL and transfers the data to the P/F check circuit 180.

The I/O circuit 170 transfers external data DATA to the column selector 160 under control of the controller 120 in a program operation so that the external data DATA is inputted to the page buffers PB of the page buffer group 150. When the column selector 160 sequentially transfers the external data DATA to the page buffers PB of the page buffer group 150, the page buffers PB store the data in their internal latches. Furthermore, in the read operation, the I/O circuit 170 externally outputs data DATA received from the page buffers PB of the page buffer group 150 through the column selector 160.

The P/F check circuit 180 checks whether errors have occurred with cells during a verify operation subsequent to a program or erase operation, and generates a result of the check in the form of a check signal PFS. Furthermore, the P/F check circuit 180 functions to count the number of error cells and to generate a result of the count in the form of the count signal CS.

The controller 120 controls the level of a program voltage supplied to a selected word line in a program operation performed on memory cells, and the controller 120 controls the voltage generator 130 so that verify voltages are selectively supplied to a selected word line in a program verify operation. The controller 120 may control the voltage generator 130 in response to the count signal CS of the P/F check circuit 180.

Figure 4:
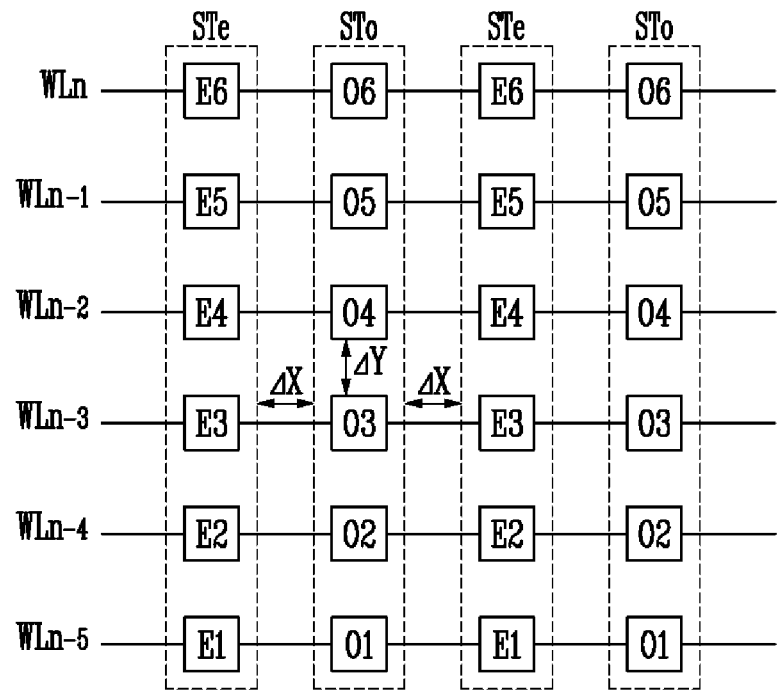
FIG. 4 is a schematic diagram of a memory cell array for illustrating a program operation according to the present disclosure.

FIG. 4 is a schematic diagram of a memory cell array for illustrating a program operation according to the present disclosure.

FIG. 4 is a diagram schematically showing the memory cell array 110 of FIG. 3. A plurality of memory cells E1 to E6 and O1 to O6 included in memory strings STe and STo, respectively, and coupled to word lines WLn−5 to WLn are shown in FIG. 4. Where word line WLn may be adjacent to word line WLn−1, and word line WLn−1 may be adjacent to word line WLn−2, etc. The program operation is described below with reference to FIG. 4.

Figure 5:
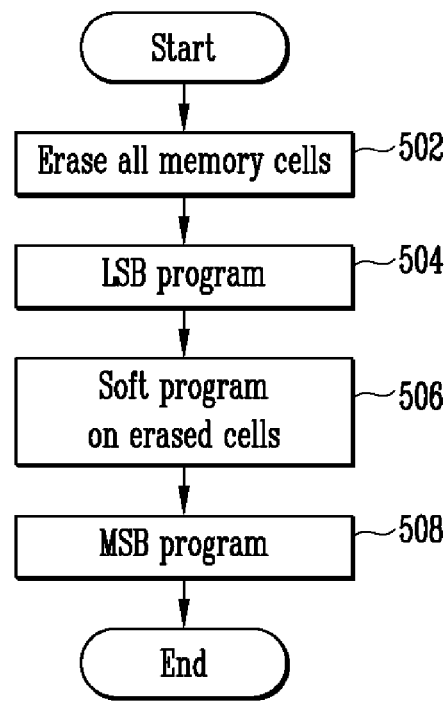
FIG. 5 is a flowchart illustrating the program operation according to the present disclosure.

FIG. 5 is a flowchart illustrating a program operation according to the present disclosure.

One memory cell (for example, O3 of FIG. 4) is described below with reference to FIGS. 5 and 4. After an erase operation is performed, an LSB program operation is performed without performing a soft program operation. After the LSB program operation is completed, a soft program operation is performed prior to an MSB program operation, and the MSB program operation is then performed.

When a program operation is started, all the memory cells of a selected memory block are erased (502), and an LSB program operation is performed on selected memory cells (504). After the LSB program operation is completed, a soft program operation is performed on memory cells having an erase state on which the LSB program operation has not been performed (506). The soft program operation is an operation which involves raising the threshold voltages of memory cells having an erase state to within a range lower than 0 V and may be performed in accordance with an ISPP method. When the soft program operation is performed, the threshold voltages of the memory cells having an erase state rise. Accordingly, a distribution of the threshold voltages of the memory cells having an erase state may rise, and the width of the distribution may be narrowed. As a result, it may be easier to perform a subsequent MSB program operation. Next, the MSB program operation is performed on selected memory cells (508).

After all the erase, LSB program, soft program, and MSB program operations are performed on the selected memory cells, a program operation is not performed on next memory cells, but the erase, LSB program, soft program, and MSB program operations are performed on some memory cells in a specific order. This program method is described in detail below.

Program Method According to a First Embodiment

In the program method according to the first embodiment, LSB program, soft program, and MSB program operations are performed on memory cells included in the even memory strings STe and the odd memory strings STo.

When a program operation is started, all the memory cells E1 to E6 and O1 to O6 included in a selected memory cell block are erased. The erase operation may be performed by supplying an erase voltage to the well of the selected memory block and by supplying a ground voltage to all the word lines WLn−5 to WLn or floating all the word lines WLn−5 to WLn. The erase operation may be performed in accordance with an Incremental Step Pulse Erase (ISPE) method that may be performed by gradually raising the erase voltage. In the erase operation, a positive voltage corresponding to a program inhibition voltage is supplied to all bit lines (BLe and BLo of FIG. 3) in order to increase erase operation efficiency.

After the erase operation is completed, the program operation is performed in an order of operation indicated by the numbers 1, 2, . . . 36, listed in Table 1 below.

TABLE 1

| STe | ORDER OF OPERATIONS | STo | ORDER OF OPERATIONS |
|---|---|---|---|
| E6 | 25, 31, 35 | O6 | 27, 32, 36 |
| E5 | 19, 26, 33 | O5 | 21, 28, 34 |
| E4 | 13, 20, 29 | O4 | 15, 22, 30 |
| E3 | 7, 14, 23 | O3 | 9, 16, 24 |
| E2 | 3, 8, 17 | O2 | 5, 10, 18 |
| E1 | 1, 4, 11 | O1 | 2, 6, 12 |

Referring to Table 1 and FIG. 4, an LSB program operation is performed on memory cells, selected from among the first even memory cells E1 which are included in the respective even memory strings STe and are coupled to the $(n-5)^{th}$ word line WLn−5 (1). Because the LSB program operation is performed on a word line including even memory strings, the LSB program operation is performed on an even page. Also, because the LSB program operation is performed on an even page, the LSB program operation may be an even LSB program operation. The LSB program operation may be performed in accordance with an ISPP method that may be performed by gradually raising a program voltage. More particularly, the LSB program operation is performed by supplying a program permission voltage (for example, 0 V) to bit lines coupled to memory strings, selected from among the even memory strings STe, supplying a program inhibition voltage (for example, the power source voltage) to the remaining bit lines, supplying a program voltage to the selected $(n-5)^{th}$ word line WLn−5, and supplying a pass voltage to the remaining word lines. As a result of the LSB program operation, if there are memory cells having threshold voltages that have not reached a target level, from among the selected memory cells, the program voltage is raised, and the LSB program operation is performed again. The LSB program operation is performed while gradually raising the program voltage until all the selected memory cells reach the target threshold voltage level.

After the LSB program operation on the selected memory cells of the first even memory cells E1 is completed, the LSB program operation is performed on memory cells selected from among the first odd memory cells O1 which are included in the respective odd memory strings STo and are coupled to the $(n-5)^{th}$ word line WLn−5 (2). Because the LSB program operation is performed on a word line including odd memory strings, the LSB program operation is performed on an odd page. Also, because the LSB program operation is performed on an odd page, the LSB program operation may be an odd LSB program operation.

After the LSB program operation on the selected memory cells of the first odd memory cells O1 is completed, the LSB program operation is performed on memory cells selected from among the second even memory cells E2 which are included in the respective even memory strings STe and are coupled to the $(n-4)^{th}$ word line WLn−4 (3).

After the LSB program operation on the selected memory cells of the second even memory cells E2 is completed, a soft program operation is performed on all memory cells having an erase state, from among the first even memory cells E1 (4).

The soft program operation may be performed in accordance with an ISPP method. Here, the soft program operation is performed for each page. That is, the soft program operation is performed on a page including the first even memory cells E1, but is performed by supplying a program inhibition voltage to bit lines coupled to memory strings, including memory cells on which the LSB program operation has been completed, and supplying a program permission voltage to bit lines coupled to the remaining memory strings. Because the soft program operation is performed on memory cells included in an even page, the soft program operation may be an even soft program operation. In this case, the soft program operation is performed by supplying a program voltage to a selected word line coupled to the gates of the first even memory cells E1 and supplying a pass voltage to the remaining word lines. After the soft program operation is performed, the threshold voltages of the memory cells having an erase state may be raised to within a range lower than 0 V, and the width of a distribution of the threshold voltages of the erased memory cells may be narrowed.

The LSB program operation is performed on memory cells, selected from among the second odd memory cells O2 which are included in the respective odd memory strings STo and are coupled to the $(n-4)^{th}$ word line WLn−4 (5).

The soft program operation is performed on all memory cells having an erase state on which the LSB program operation has not been performed, from among the first odd memory cells O1 (6). Because the soft program operation is performed on memory cells included in an odd page, the soft program operation may be an odd soft program operation. After the soft program operation is performed, the threshold voltages of the memory cells having an erase state may be raised to within a range lower than 0 V, and the width of a distribution of the threshold voltages of the erased memory cells may be narrowed.

The LSB program operation is performed on memory cells, selected from among the third even memory cells E3 which are included in the respective even strings STe and are coupled to the $(n-3)^{th}$ word line WLn−3 (7).

The soft program operation is performed on all memory cells having an erase state on which the LSB program operation has not been performed, from among the second even memory cells E2 (8). After the soft program operation is performed, the threshold voltages of the memory cells having an erase state may be raised to within a range lower than 0 V, and the width of a distribution of the threshold voltages of the erased memory cells may be narrowed.

The LSB program operation is performed on memory cells, selected from among the third odd memory cells O3 which are included in the respective odd memory strings STo and are coupled to the $(n-3)^{th}$ word line WLn-3 (9).

The soft program operation is performed on all memory cells having an erase state on which the LSB program operation has not been performed, from among the second odd memory cells O2 (10). After the soft program operation is performed, the threshold voltages of the memory cells having an erase state may be raised to within a range lower than 0 V, and the width of a distribution of the threshold voltages of the erased memory cells may be narrowed.

The program operation is completed on the first even memory cells E1 by performing the MSB program operation on memory cells, selected from among the first even memory cells E1 (11). More particularly, the MSB program operation may be performed in accordance with an ISPP method of gradually raising the program voltage. That is, the MSB program operation may be performed by supplying a program permission voltage to bit lines coupled to selected memory strings including the selected memory cells, supplying a program inhibition voltage to the remaining bit lines, supplying a program voltage to a selected word line, and supplying the pass voltage to the remaining word lines. If the threshold voltages of the selected memory cells have not reached the target level after the MSB program operation is performed, the program operation is repeated performed while gradually raising the program voltage, and the MSB program operation is completed when all the selected memory cells reach the target threshold voltage level.

Next, the program operation on the first odd memory cells O1 is completed by performing the MSB program operation on the selected memory cells of the first odd memory cells O1 (12).

The LSB program operation is performed on memory cells, selected from among the fourth even memory cells E4 which are included in the respective even memory strings STe and are coupled to the $(n-2)^{th}$ word line WLn-2 (13).

The soft program operation is performed on all memory cells having an erase state, from among the third even memory cells E3 (14). After the soft program operation is performed, the threshold voltages of the memory cells having an erase state may be raised to within a range lower than 0 V, and the width of a distribution of the threshold voltages of the erased memory cells may be narrowed.

The LSB program operation is performed on memory cells, selected from among the fourth odd memory cells O4 which are included in the respective odd memory strings STo and are coupled to the $(n-2)^{th}$ word line WLn-2 (15).

The soft program operation is performed on all memory cells having an erase state on which the LSB program operation has not been performed, from among the third odd memory cells O3 (16). After the soft program operation is performed, the threshold voltages of the memory cells having an erase state may be raised to within a range lower than 0 V, and the width of a distribution of the threshold voltages of the erased memory cells may be narrowed.

The program operation on the second even memory cells E2 is completed by performing the MSB program operation on the selected memory cells of the second even memory cells E2 (17).

The program operation on the second odd memory cells O2 is completed by performing the MSB program operation on the selected memory cells of the second odd memory cells O2 (18).

The LSB program operation is performed on memory cells, selected from among the fifth even memory cells E5 which are included in the respective even memory strings STe and are coupled to the $(n-1)^{th}$ word line WLn-1 (19).

The soft program operation is performed on all memory cells of an erase state, from among the fourth even memory cells E4 (20). After the soft program operation is performed, the threshold voltages of the memory cells having an erase state may be raised to within a range lower than 0 V, and the width of a distribution of the threshold voltages of the erased memory cells may be narrowed.

The LSB program operation is performed on memory cells, selected from among the fifth odd memory cells O5 which are included in the respective odd memory strings STo and are coupled to the $(n-1)^{th}$ word line WLn-1 (21).

The soft program operation is performed on all memory cells having an erase state on which the LSB program operation has not been performed, from among the fourth odd memory cells O4 (22). After the soft program operation is performed, the threshold voltages of the memory cells having an erase state may be raised to within a range lower than 0 V, and the width of a distribution of the threshold voltages of the erased memory cells may be narrowed.

The program operation on the third even memory cells E3 is completed by performing the MSB program operation on the selected memory cells of the third even memory cells E3 (23).

The program operation on the third odd memory cells O3 is completed by performing the MSB program operation on the selected memory cells of the third odd memory cells O3 (24).

The LSB program operation is performed on memory cells selected from among the sixth even memory cells E6 which are included in the respective even memory strings STe and are coupled to the $n^{th}$ word line WLn (25).

The soft program operation is performed on all memory cells having an erase state, from among the fifth even memory cells E5 (26). After the soft program operation is performed, the threshold voltages of the memory cells having an erase state may be raised to within a range lower than 0 V, and the width of a distribution of the threshold voltages of the erased memory cells may be narrowed.

The LSB program operation is performed on memory cells, selected from among the sixth odd memory cells O6 which are included in the respective odd memory strings STo and are coupled to the $n^{th}$ word line WLn (27).

The soft program operation is performed on all memory cells of an erase state on which the LSB program operation has not been performed, from among the fifth odd memory cells O5 (28). After the soft program operation is performed, the threshold voltages of the memory cells having an erase state may be raised to within a range lower than 0 V, and the width of a distribution of the threshold voltages of the erased memory cells may be narrowed.

The program operation on the fourth even memory cells E4 is completed by performing the MSB program operation on the selected memory cells of the fourth even memory cells E4 (29).

The program operation on the fourth odd memory cells O4 is completed by performing the MSB program operation on the selected memory cells of the fourth odd memory cells O4 (30).

The soft program operation is performed on all memory cells having an erase state, from among the sixth even memory cells E6 (31). After the soft program operation is performed, the threshold voltages of the memory cells having an erase state may be raised to within a range lower than 0 V, and the width of a distribution of the threshold voltages of the erased memory cells may be narrowed.

The soft program operation is performed on all memory cells having an erase state on which the LSB program operation has not been performed, from among the sixth odd memory cells O6 (32). After the soft program operation is performed, the threshold voltages of the memory cells having an erase state may be raised to within a range lower than 0 V, and the width of a distribution of the threshold voltages of the erased memory cells may be narrowed.

The program operation on the fifth even memory cells E5 is completed by performing the MSB program operation on the selected memory cells of the fifth even memory cells E5 (33).

The program operation on the fifth odd memory cells O5 is completed by performing the MSB program operation on the selected memory cells of the fifth odd memory cells O5 (34).

The program operation on the sixth even memory cells E6 is completed by performing the MSB program operation on the selected memory cells of the sixth even memory cells E6 (35).

The program operation on the sixth odd memory cells O6 is completed by performing the MSB program operation on the selected memory cells of the sixth odd memory cells O6 (36).

If, as in the first embodiment, the LSB program operation is performed and the soft program operation and the MSB program operation are then performed, the influence of interferences between adjacent cells occurring in a program operation can be suppressed.

Program Method According to a Second Embodiment

In the program method according to the second embodiment, LSB program and MSB program operations are performed on the memory cells E1 to E6 and O1 to O6 included in the even memory strings STe and the odd memory strings STo, but a soft program operation is performed on even or odd memory strings STe or STo, thereby reducing the time taken to perform the program operation. In the following embodiment, a method of performing the soft program operation only on the odd memory strings STo is described as an example, for simplicity.

When the program operation is started, all the memory cells E1 to E6 and O1 to O6 within a selected memory cell block are erased. The erase operation is performed by supplying an erase voltage to the well of the selected memory block and by supplying a ground voltage to all the word lines WLn−5 to WLn or floating all the word lines WLn−5 to WLn. In the erase operation, it is preferred that a positive voltage corresponding to a program inhibition voltage is supplied to all the bit lines (BLe and BLo of FIG. 3).

After the erase operation is completed, the program operation is performed in order, such as that listed in Table 2 below.

TABLE 2

| STe | ORDER OF OPERATIONS | STo | ORDER OF OPERATIONS |
|---|---|---|---|
| E6 | 21, 29 | O6 | 22, 26, 30 |
| E5 | 16, 27 | O5 | 17, 23, 28 |
| E4 | 11, 24 | O4 | 12, 18, 25 |
| E3 | 6, 19 | O3 | 7, 13, 20 |
| E2 | 3, 14 | O2 | 4, 8, 15 |
| E1 | 1, 9 | O1 | 2, 5, 10 |

Referring to Table 2 and FIG. 4, an LSB program operation is performed on memory cells, selected from among the first even memory cells E1 which are included in the respective even memory strings STe and are coupled to the $(n-5)^{th}$ word line WLn−5 (1). The LSB program operation may be performed in accordance with an ISPP method, like in the first embodiment.

After the LSB program operation on the selected memory cells of the first even memory cells E1 is completed, the LSB program operation is performed on memory cells selected from among the first odd memory cells O1 which are included in the respective odd memory strings STo and are coupled to the $(n-5)^{th}$ word line WLn−5 (2).

After the LSB program operation on the selected memory cells of the first odd memory cells O1 is completed, the LSB program operation is performed on memory cells, selected from among the second even memory cells E2 which are included in the respective even memory strings STe and are coupled to the $(n-4)^{th}$ word line WLn−4 (3).

The LSB program operation is performed on memory cells, selected from among the second odd memory cells O2 which are included in the respective odd memory strings STo and are coupled to the $(n-4)^{th}$ word line WLn−4 (4).

The soft program operation is performed on all memory cells having an erase state on which the LSB program operation has not been performed, from among the first odd memory cells O1 (5). After the soft program operation is performed, the threshold voltages of the memory cells having an erase state may be raised to within a range lower than 0 V, and the width of a distribution of the threshold voltages of the erased memory cells may be narrowed.

The LSB program operation is performed on memory cells, selected from among the third even memory cells E3 which are included in the respective even strings STe and are coupled to the $(n-3)^{th}$ word line WLn−3 (6).

The LSB program operation is performed on memory cells, selected from among the third odd memory cells O3 which are included in the respective odd memory strings STo and are coupled to the $(n-3)^{th}$ word line WLn−3 (7).

The soft program operation is performed on all memory cells having an erase state on which the LSB program operation has not been performed, from among the second odd memory cells O2 (8). After the soft program operation is performed, the threshold voltages of the memory cells having an erase state may be raised to within a range lower than 0 V, and the width of a distribution of the threshold voltages of the erased memory cells may be narrowed.

The program operation on the first even memory cells E1 is completed by performing the MSB program operation on the selected memory cells of the first even memory cells E1 (9).

The program operation on the first odd memory cells O1 is completed by performing the MSB program operation on the selected memory cells of the first odd memory cells O1 (10).

The LSB program operation is performed on memory cells, selected from among the fourth even memory cells E4 which are included in the respective even memory strings STe and are coupled to the $(n-2)^{th}$ word line WLn−2 (11).

The LSB program operation is performed on memory cells, selected from among the fourth odd memory cells O4 which are included in the respective odd memory strings STo and are coupled to the $(n-2)^{th}$ word line WLn−2 (12).

The soft program operation is performed on all memory cells having an erase state on which the LSB program operation has not been performed, from among the third odd memory cells O3 (13). After the soft program operation is performed, the threshold voltages of the memory cells having an erase state may be raised to within a range lower than 0 V, and the width of a distribution of the threshold voltages of the erased memory cells may be narrowed.

The program operation on the second even memory cells E2 is completed by performing the MSB program operation on the selected memory cells of the second even memory cells E2 (14).

The program operation on the second odd memory cells O2 is completed by performing the MSB program operation on the selected memory cells of the second odd memory cells O2 (15).

The LSB program operation is performed on memory cells, selected from among the fifth even memory cells E5 which are included in the respective even memory strings STe and are coupled to the $(n-1)^{th}$ word line WLn−1 (16).

The LSB program operation is performed on memory cells, selected from among the fifth odd memory cells O5 which are included in the respective odd memory strings STo and are coupled to the $(n-1)^{th}$ word line WLn−1 (17).

The soft program operation is performed on all memory cells having an erase state on which the LSB program operation has not been performed, from among the fourth odd memory cells O4 (18). After the soft program operation is performed, the threshold voltages of the memory cells having an erase state may be raised to within a range lower than 0 V, and the width of a distribution of the threshold voltages of the erased memory cells may be narrowed.

The program operation on the third even memory cells E3 is completed by performing the MSB program operation on the selected memory cells of the third even memory cells E3 (19).

The program operation on the third odd memory cells O3 is completed by performing the MSB program operation on the selected memory cells of the third odd memory cells O3 (20).

The LSB program operation is performed on memory cells, selected from among the sixth even memory cells E6 which are included in the respective even memory strings STe and are coupled to the $n^{th}$ word line WLn (21).

The LSB program operation is performed on memory cells, selected from among the sixth odd memory cells O6 which are included in the respective odd memory strings STo and are coupled to the $n^{th}$ word line WLn (22).

The soft program operation is performed on all memory cells of an erase state on which the LSB program operation has not been performed, from among the fifth odd memory cells O5 (23). After the soft program operation is performed, the threshold voltages of the memory cells having an erase state may be raised to within a range lower than 0 V, and the width of a distribution of the threshold voltages of the erased memory cells may be narrowed.

The program operation on the fourth even memory cells E4 is completed by performing the MSB program operation on the selected memory cells of the fourth even memory cells E4 (24).

The program operation on the fourth odd memory cells O4 is completed by performing the MSB program operation on the selected memory cells of the fourth odd memory cells O4 (25).

The soft program operation is performed on all memory cells having an erase state on which the LSB program operation has not been performed, from among the sixth odd memory cells O6 (26). After the soft program operation is performed, the threshold voltages of the memory cells having an erase state may be raised to within a range lower than 0 V, and the width of a distribution of the threshold voltages of the erased memory cells may be narrowed.

The program operation on the fifth even memory cells E5 is completed by performing the MSB program operation on the selected memory cells of the fifth even memory cells E5 (27).

The program operation on the fifth odd memory cells O5 is completed by performing the MSB program operation on the selected memory cells of the fifth odd memory cells O5 (28).

The program operation on the sixth even memory cells E6 is completed by performing the MSB program operation on the selected memory cells of the sixth even memory cells E6 (29).

The program operation on the sixth odd memory cells O6 is completed by performing the MSB program operation on the selected memory cells of the sixth odd memory cells O6 (30).

If, as in the second embodiment, the LSB program operation is performed and the soft program operation and the MSB program operation are then performed, the influence of interferences between adjacent cells occurring in the program operation can be suppressed. In case of the second embodiment, greater interference may be generated as compared with the first embodiment because the soft program operation is not performed on the even memory strings STe, but the time taken to perform the program operation can be reduced.

Figure 6:
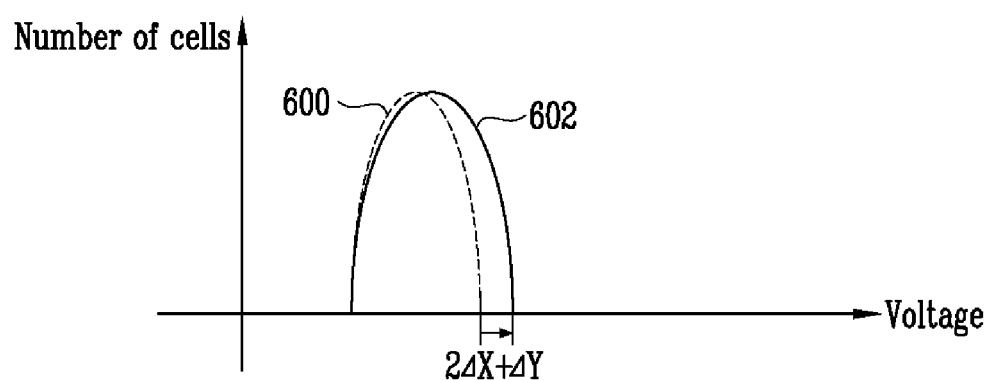
FIG. 6 is a graph illustrating a shift in threshold voltages according to the program operation of the present disclosure.

FIG. 6 is a graph illustrating a shift in threshold voltages according to the program operation of the present disclosure.

Referring to FIG. 6, when a program operation is performed as described above, a selected memory cell may be subject to interferences 2ΔX, occurring in program operations performed on two memory cells adjacent to the selected memory cell, belonging to different memory strings, and an interference ΔY occurring in a program operation performed on one memory cell adjacent to the selected memory cell in the same memory string.

More particularly, in case of even memory cells, after an MSB program operation on a previous cell adjacent to a selected memory cell in the same string is completed, the MSB program operation is performed on the selected memory cell. Thus, the selected memory cell is not subject to interference resulting from the program operation on the previous cell. However, after the MSB program operation is performed on the selected memory cell, the MSB program operation is performed on a next memory cell adjacent to the selected memory in the same string and adjacent odd cells. Thus, the selected memory cell may be subject to the interferences 2ΔX+ΔY. However, since the selected memory cell is not subject to interference resulting from the program operation performed on the previous cell in the same string as described above, the influence of interference may be reduced. Accordingly, a difference between a target threshold voltage 600 and a changed threshold voltage 602 can be reduced.

In the case of odd memory cells, after an MSB program operation is performed on a selected memory cell, the MSB program operation is performed on a next memory cell adjacent to the selected memory cell in the same string, from among peripheral memory cells. Thus, the selected memory cell may be subject to only the interference ΔY. As described above, in accordance with an order of the program operation proposed by the present disclosure, each of memory cells is subjected to less interference from peripheral cells as compared with the known art. Accordingly, a shift in the threshold voltages of the memory cells can be prevented or an increase in the distribution of the threshold voltages can be suppressed. Accordingly, a difference between the target threshold voltage 600 and the changed threshold voltage 602 can be reduced.

As described above, by changing an order of a soft program operation, an LSB program operation, and an MSB program operation, interferences between adjacent memory cells can be reduced, and thus the reliability of a program operation can be improved.

What is claimed is:

1. A method of programming a semiconductor device, comprising:
performing a Least Significant Bit (LSB) program operation on selected memory cells;
performing a soft program operation on remaining memory cells other than memory cells on which the LSB program operation has been performed; and
performing a Most Significant Bit (MSB) program operation on memory cells, selected from among the memory cells on which the LSB program operation has been performed and the memory cells on which the soft program operation has been performed.

2. A method of programming a semiconductor device, comprising:
performing an even Least Significant Bit (LSB) program operation on an even page including even memory cells, from among memory cells coupled to a selected word line;
performing an odd LSB program operation on an odd page including odd memory cells, from among the memory cells coupled to the selected word line;
performing an even soft program operation comprising raising threshold voltages of memory cells having an erase state, from among the even memory cells included in the even page;
performing an odd soft program operation comprising raising threshold voltages of memory cells having an erase state, from among the odd memory cells included in the odd page;
performing an even Most Significant Bit (MSB) program operation on the even page; and
performing an odd MSB program operation on the odd page.

3. The method of claim 2, further comprising performing the even soft program operation of raising threshold voltages of memory cells having an erase state, from among even memory cells coupled to a word line adjacent to the selected word line, before performing the odd LSB program operation.

4. The method of claim 2, further comprising performing the odd soft program operation of raising threshold voltages of memory cells having an erase state, from among odd memory cells coupled to a word line adjacent to the selected word line, after performing the odd LSB program operation.

5. A method of programming a semiconductor device, comprising:
performing a first Least Significant Bit (LSB) program operation on a first page including memory cells coupled to a first word line, from among a plurality of memory cells included in memory strings;
performing a second LSB program operation on a second page including memory cells coupled to a second word line adjacent to the first word line;
performing a first soft program operation on memory cells having an erase state, from among the memory cells included in the first page;
performing a third LSB program operation on a third page including memory cells coupled to a third word line adjacent to the second word line;
performing a second soft program operation on memory cells having an erase state, from among the memory cells included in the second page; and
performing a first Most Significant Bit (MSB) program operation on the first page.

6. A method of programming a semiconductor device, comprising:
performing a Least Significant Bit (LSB) program operation on a first even page including even memory cells coupled to a first word line, from among memory cells included in even-numbered memory strings;
performing the LSB program operation on a first odd page including odd memory cells coupled to the first word line, from among memory cells included in odd-numbered memory strings;
performing the LSB program operation on a second even page including memory cells coupled to a second word line adjacent to the first word line, from among the memory cells included in the even-numbered memory strings;
performing the LSB program operation on a second odd page including memory cells coupled to the second word line, from among the memory cells included in the odd-numbered memory strings;
performing a soft program operation of raising threshold voltages of memory cells having an erase state, from among the memory cells included in the first odd page;
performing the soft program operation of raising threshold voltages of memory cells having an erase state, from among the memory cells included in the second odd page; and
performing a Most Significant Bit (MSB) program operation on the first even page.

7. The method of claim 6, further comprising performing the LSB program operation on a third even page including memory cells coupled to a third word line adjacent to the second word line, from among the memory cells included in the even-numbered memory strings, after performing a soft program operation of raising threshold voltages of memory cells having an erase state, from among the memory cells included in the first odd page.

8. The method of claim 7, further comprising performing the LSB program operation on a third odd page including memory cells coupled to the third word line, from among the memory cells included in the odd-numbered memory strings, after performing the LSB program operation on a third even page.

9. The method of claim 6, further comprising performing the MSB program operation on the first odd page, after performing the MSB program operation on the first even page.

10. The method of claim 6, further comprising performing the soft program operation of raising threshold voltages of memory cells having an erase state, from among the memory cells included in the first even page, between performing the LSB program operation on the second even page and the LSB program operation on the second odd page.

11. A semiconductor device, comprising:
a memory cell array configured to comprise a plurality of memory blocks;
a row decoder coupled to the memory cell array through word lines;
a page buffer group coupled to the memory cell array through bit lines; and
a controller configured to control the page buffer group so that a Least Significant Bit (LSB) program operation is performed on selected memory cells included in a memory block selected from among the memory blocks, a soft program operation is performed on remaining memory cells other than memory cells on which the LSB program operation has been performed, from among the memory cells included in the selected memory block, and a Most Significant Bit (MSB) program operation is performed on memory cells, selected from among the memory cells on which the LSB program operation has been performed and the memory cells on which the soft program operation has been performed.

* * * * *